United States Patent [19]

Fonash et al.

[11] Patent Number: 5,359,186
[45] Date of Patent: Oct. 25, 1994

[54] PARTICLE DETECTOR FOR DETECTING IONIZING PARTICLES HAVING A POTENTIAL BARRIER FORMED IN A REGION OF DEFECTS

[75] Inventors: Stephen J. Fonash, State College; Jing-ya Hou, University Park, both of Pa.; Francisco A. Rubinelli, Santa Fe, Argentina

[73] Assignee: Pennsylvania State University, University Park, Pa.

[21] Appl. No.: 23,846

[22] Filed: Feb. 26, 1993

Related U.S. Application Data

[63] Continuation-in-part of Ser. No. 888,769, May 22, 1992, abandoned.

[51] Int. Cl.$^5$ .............................................. H01J 40/14
[52] U.S. Cl. ...................... 250/214 PR; 250/370.14; 257/458
[58] Field of Search .......... 250/214 PR, 226, 214 LS, 250/214 LA, 214 R, 370.14, 370.15; 257/617, 458, 459, 464

[56] References Cited

U.S. PATENT DOCUMENTS

| | | | |
|---|---|---|---|
| 4,586,068 | 4/1986 | Petroff et al. | 257/458 |
| 4,714,824 | 12/1987 | Terazono . | |
| 4,739,383 | 4/1988 | Maruska et al. . | |
| 4,962,304 | 10/1990 | Stapelbroek et al | 250/370.14 |
| 5,030,831 | 7/1991 | Coon et al. | 257/458 |

OTHER PUBLICATIONS

Marusaka; "Optically Controlled Amorphous Silicon Photosensitive Device"; IEEE Transistor Electronic Devices vol. ED–32 pp. 1343–1345, (1984).
Crandal; "Photoconductivity and Transport in Hydrogenated Amorphous Silicon"; Solar Cells, pp. 319–330 (1980).
Crandal; "Semiconductors and Semimetals"; vol. 21, Part B, Chapter 8, Academic Press Inc. (1984); pp. 245–247 & 264–297.
R. A. Street, "Measurements of Depletion Layers . . . ", Physical Review B, vol. 27, No. 8, 4924 (1983); pp. 4924–4932.
Hack et al., "Amorphous Silicon Photoconductive Diode", Applied Physics Letter, 54(2), (1989), pp. 96–98.

*Primary Examiner*—David C. Nelms
*Assistant Examiner*—Que T. Le
*Attorney, Agent, or Firm*—Claude A. S. Hamrick

[57] ABSTRACT

A particle detector for detecting ionizing particles incident on the detector which form electron-hole pairs upon penetrating the detector, the detector comprising a substrate, a first electrode formed on the substrate, a body portion supported by the first electrode, a second electrode formed over the body portion, and a voltage source for applying a forward bias voltage across the first and the second electrodes. The body portion includes two monolithic, contiguous amorphous silicon regions. A first region is doped to be of a first conductivity type, and a second region is an intrinsic region. The applied forward bias voltage must be greater than the flat band voltage of the detector and sufficient to bias the detector into the space charge limited regime so that charge carriers, injected at the first electrode, are blocked by a potential barrier formed near the interface between the first and the second regions. When an ionizing particle penetrates the detector, the hole (or electron) formed thereby moves towards and modulates the potential barrier to allow previously blocked charge carriers to pass over the barrier, to move across the detector and to be collected by the second electrode to provide an enhanced signal in response to the ionizing particle. The ratio of carriers, so produced, to ionizing particles (i.e. the gain) can exceed 1000.

17 Claims, 5 Drawing Sheets

PARTICLE DETECTOR FOR DETECTING IONIZING PARTICLES HAVING A POTENTIAL BARRIER FORMED IN A REGION OF DEFECTS

RELATED CASES

This case is a continuation-in-part of co-pending U.S. Ser. No. 07/888,769 filed May 22, 1992, now abandoned in the name of Hou et al. and assigned to the assignees hereof.

BACKGROUND OF THE INVENTION

1. Field of the Invention

This invention relates to semiconductor photodetector devices and more particularly to enhancing the photocurrent gain of a photodetector by applying a bias voltage across it.

2. Terms of Art

In this specification a number of terms of art are used and should be taken to have the following meanings:

(i) The term amorphous encompasses not only traditional amorphous materials that lack long-range atomic order, but also includes nano- or microcrystalline materials that contain tiny crystallites within a surrounding disordered matrix.

(ii) Chopped beam of light encompasses any beam of light which is periodically and briefly interrupted or otherwise modulated to cause the beam of light to be intermittent. Traditionally the term chopped light designates a repetitively on/off condition of the beam. As used herein, however, the term should also be taken to include intermittent light produced by other means.

(iii) The term dark current means the current flowing through a photodetector under action of an applied voltage when no light is incident on the detector.

(iv) The flat band voltage of a photodetector is the voltage that must be applied to the detector to overcome the built-in or inherent electric potential across a semiconductor photodetector.

(v) The photocurrent gain of a photodetector is defined by the equation:

$$G(\lambda) = \Delta J_{ph}(\lambda)/e\Phi(\lambda)$$

where $\Delta J_{ph}(\lambda)$ is the change in the photogenerated current occurring in response to a signal light of wavelength $\lambda$, $\Phi(\lambda)$ is the flux density of the signal light and e is the charge of an electron.

BRIEF DESCRIPTION OF THE PRIOR ART

A photodetector is typically a semiconductor device which produces an electric signal in response to light impinging thereon by converting light photons into charge carriers (electrons).

Photodetectors are often used as light sensitive elements in apparatus which requires a response to a given light signal. Applications include, but are not limited to, devices such as scanners in photocopiers or fax machines; detectors for military applications; detectors in CAT scanners; and similar devices used in real time holography and real time signal processing.

From the above listed applications, it will be readily understood that the photocurrent gain of the photodetector (i.e. how efficiently it converts light photons into electrons) is of great importance in many of the above applications. Unfortunately, however, the inherent inefficiency (and consequential low gain) of photodetectors can lead to problems when they are used to detect a weak light signal because the resulting electric response signal is correspondingly even weaker. This makes the detection of weak light signals difficult and sometimes inaccurate. What is, therefore, required is a means of enhancing the gain of the detector to produce a larger electric signal produced by the photodetector.

It is, of course, possible to electronically amplify a weak electric signal but certain problems are associated with such amplification. For example, if amplification occurs away from the point of detection (i.e. away from the device), electronic noise increases. If amplification is done at the point of detection, this requires transistors at the photodetector, resulting in a complex arrangement, particularly in the case of large arrays of detectors which would require transistors at each node of the array to provide the amplification. This would greatly increase the cost of manufacture as well as reduce the number of photodetectors which can be accommodated per unit area of the array.

Electronic amplification of the signal is therefore undesirable and other means of enhancing a photogenerated signal need to be explored.

One possible method of enhancing the signal has been suggested in an article of the Institute of Electronic and Electrical Engineers publication entitled Transistor Electronic Devices, vol. ED-32, pp. 1343–1345, 1984, published by Marusky, et al.

This article teaches the use of a light degraded Schottky barrier structure (an m-i-n semiconductor device) to produce an electric signal in response to a light signal incident on the detector. The electronic signal, according to the article, can be optically enhanced by the use of blue light from a different source. The enhanced signal so produced had a measured efficiency of about 105%. (A gain of about 1.05)

Another method of producing an enhanced photogenerated signal is disclosed in U.S. Pat. No. 4,714,824 (Terazono). This patent teaches the use of a p-i-n photodetector in very much the same manner as the Marusky article does and reports a gain of a similar order of magnitude (about 1.5).

Although these gains are greater than 1.0, they are not significantly so and do, therefore, not compensate for accuracy losses relating to the detection of weak incoming light signals. What is required is a photogain of much greater than 1.0.

Gain values of greater than 1.0 have also been reported for other simple hydrogenated amorphous silicon (a-Si:H) structures.

For example, long wavelength gains of less than 100 have been reported in articles by R. S. Crandall (*Solar Cells*, 2, 319 (1980) and *Semiconductors and Semimetals*, Vol 21, Part B, Chapter 8, Academic Press, Inc, (1984). These gains were reported for a signal light having photon energies in the range from 0.8 to 1.8 eV and for an a-Si:H Schottky barrier structure. These photoconductive gains G were analyzed as straight forward secondary photocurrent (SPC) and were, therefore, attributed simply to the ratio of the electron lifetime $\tau_n$ to the transit time $T_r$; i.e., to large values of gain $G = \tau_n/T_r$.

Other reports can be found of high photogains for simple structures. As an example, Street, using resistor like a-Si:H structures with semitransparent ohmic chrome contacts, found transient charge collection gains G up to $2 \times 10^4$ in 4–7 μm thick undoped a-Si:H structures. (R. A. Street, *Physican Review B*, 27, 4924

(1983)). This report deals specifically with transient charge collection and for photon energies of approximately equal to 2.25 eV.

More complicated a-Si:H based photodetectors have also been explored and have been reported to yield gains greater than 100. An example is the $n^+$-i-$p^v$-i-$n^+$ structure of Hack et al. They proposed that the gain observed in this device was due to photoconductivity modulation and not to potential barrier modulation. The wavelength range of the signal light producing this gain was not reported. (See M. Hack, M. Shu, and C. C. Tsai, *Applied Physics Letter*, 54, 96 (1989)).

None of the above, however, address the problem of accurately detecting a very weak light in the long wavelength ranges, particularly the issue of exactly how to produce gains of greater than 100 in a photodetector with a simple structure. More importantly, as will be shown below, neither Crandall nor Street give a correct explanation or analysis of the effects observed thereby precluding the effective use of their results in usable devices and applications.

Thus it is apparent that a need still exists for a method and apparatus for enhancing the photocurrent gain in a simple amorphous silicon photodetector to a level well above 100.

SUMMARY OF THE INVENTION

Objects of the Invention

It is therefore an object of this invention to provide for a method for enhancing the photocurrent gain in a photodetector.

It is another object of this invention to provide such enhancement without the use of complex electronic amplification means.

It is yet another object of this invention to provide such enhancement by using a bias voltage applied across the photodetector.

It is also an object of this invention to provide a method for enhancing the photocurrent gain in a photodetector to a level above 100.

Summary

Briefly, according to one embodiment of this invention, a particle detector for detecting ionizing particles, which form electron-hole pairs upon penetrating the detector, comprises:

(i) a substrate;

(ii) first electrode means formed on said substrate;

(iii) a body portion supported by said first electrode, said body portion including at least two monolithic, contiguous amorphous silicon regions wherein one of said regions is doped to be of a first conductivity type and the other of said regions is an intrinsic region and wherein a high number of defects are present at or near the interface between said two regions;

(iv) second electrode means formed over said body portion; and (v) means to apply a forward bias voltage across said detector. The forward bias voltage must be greater than the flat band voltage of the detector and be sufficient to bias the detector into the space charge limited regime in which electrons, injected at the second electrode, are blocked by a potential barrier formed near the interface between the contiguous regions.

When an ionizing particle penetrates the detector the hole formed thereby moves towards and modulates the potential barrier to allow previously blocked electrons to pass over said barrier to move across the detector and be collected by the second electrode to an enhanced signal in response to the ionizing particles penetrating the detector.

Preferably the intrinsic layer in the body portion has as few defects as possible.

In the detector of the invention the ratio of electrons, passing across the modulated potential barrier to be collected by the second electrode, to the number of ionizing particles entering the body of the detector (i.e. the gain G) can be greater than 100 and, in some cases, even greater than 1000.

The detector is preferably one of a group consisting of an m-i-n, m-i-p, p-i-n, n-i-p, p-i-p and n-i-n detectors.

Advantages of the Invention

This invention has the advantage of providing means for enhancing the photocurrent gain in a response signal produced by a simple amorphous silicon (or related material) photodetector to a level well above 100.

A further advantage is that such enhancement can be achieved with the use of only a simple photodetector and a means of applying a forward bias voltage across it. As a result complex amplification means is not required.

Yet another advantage is that the method of this invention can be used to detect and analyze very weak incoming light signals.

Still a further advantage of this invention is that it can be used to detect particles other than light photons.

These and other objects and advantages of the present invention will no doubt become apparent to those skilled in the art after having read the following detailed description of the preferred embodiment which is illustrated in the several figures of the drawing.

DESCRIPTION OF A PREFERRED EMBODIMENT

Description of Experimental Results

Figure 1:
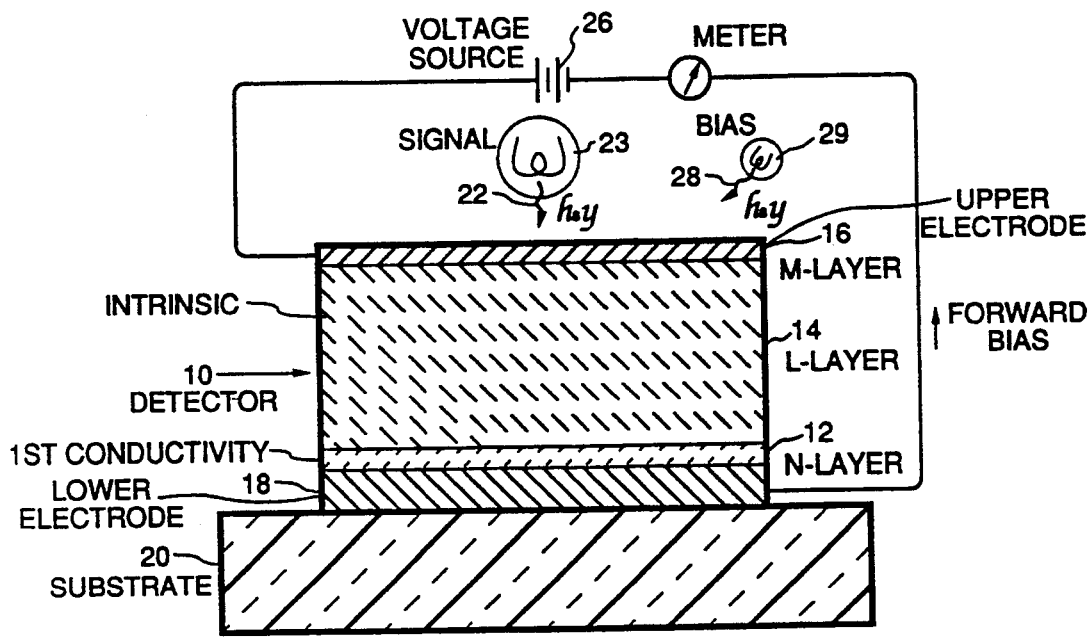
FIG. 1 is a diagrammatical cross-section of an m-i-n photodetector device used to illustrate this invention.

In FIG. 1 a photodetector 10 in the form of a Schottky barrier (m-i-n) structure is illustrated. The photodetector 10 exhibits a Ni/(i)a-Si:H/(n+)a-Si:H structure and, more specifically, consists of a 300Å thick n-layer 12, followed by a 3 $\mu$m thick, intrinsic i-layer 14 and a Nickel m-layer 16. Both the n-layer 12 and the i-layer 14 consist of amorphous silicon (a-Si:H) with the n-layer 12 having been grown on a layer 18 of specular tin oxide and the i-layer formed by ex-situ glow discharge deposition of silane. The result of the ex-situ deposition of the i-layer is that the number of defect or trap states at the interface between the i- and n-layers. The importance of these (or other defects) at this interface will become apparent below.

The m-layer 16 is formed by thermal evaporation of the Nickel onto the i-layer 14 to form an intimate metal contact. It also acts as an upper electrode and is so thin that it is transparent to light. The layer of tin oxide 18 serves as a lower electrode. For structural purposes the entire detector 10 is mounted on a glass substrate 20.

In operation, the detector 10 generates photocurrent by the photoelectric conversion of photons (represented by arrow 22), from a signal light source 23, which are incident on the m-layer 16. The generated photocurrent is withdrawn from the detector by the upper and lower electrodes 16,18 and is measured by a meter 24 which includes a lock-in amplifier. In addition, a voltage can be applied across the photodetector 10 from a voltage source 26. Bias light, indicated by an arrow 28, can be applied to the photodetector from a secondary light source 29. The function and effect of this bias light will explained below.

This invention can best be illustrated by describing experiments conducted with a photodetector 10, similar to that as described above, in which measurements of photocurrent gain G were made.

The measurements were made using a signal light 22 with a wavelength ranging from 400 to 750 nm and having a flux density of between $6 \times 10^{13}$ and $2 \times 10^{14} cm^{-2} s^{-1}$. The signal light 22 was chopped at a frequency of 13.5 Hertz. In addition, measurements were made with and without the use of the bias light 28 and, when used, with two different bias lights: one red and the other blue. The red bias light had a flux density of approximately $5 \times 10^{15} cm^{-2} s^{-1}$ (centered at $\lambda = 0.62$ $\mu$m and with bandwidth approximately 0.06 $\mu$m) and the blue bias light a flux density of approximately $10^{15} cm^{-2} s^1$ (with a cut off wavelength approximately 0.42 $\mu$m).

Figure 2:
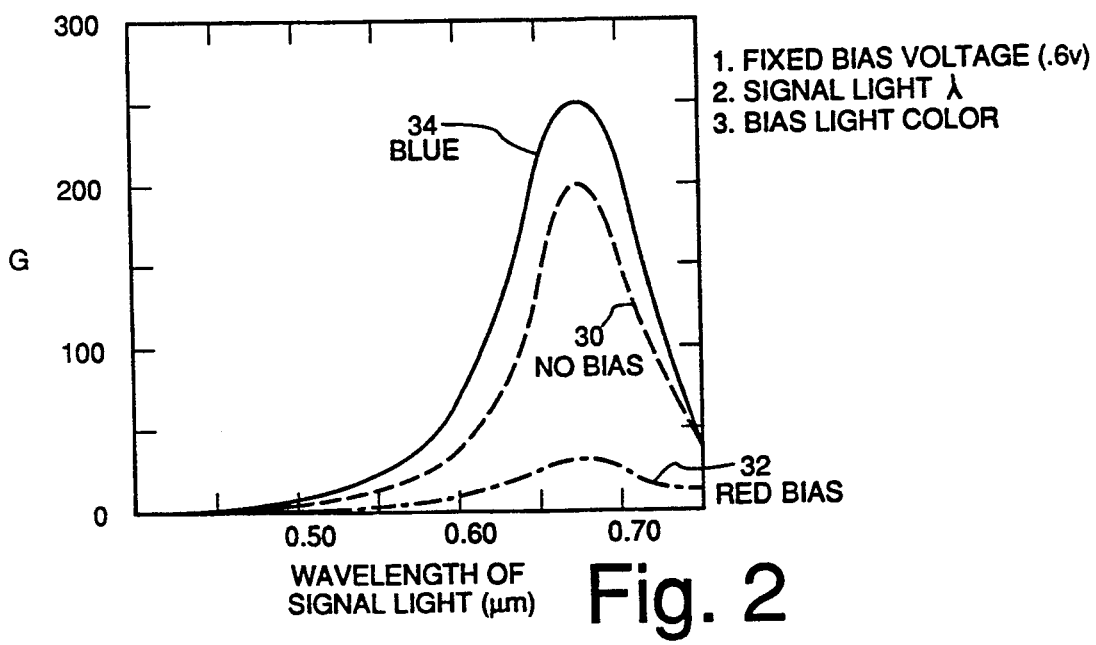
FIG. 2 is a plot of measured photocurrent gain G versus signal light wavelength illustrating the invention for a condition of a forward bias voltage fixed at 0.6 V under three different bias light environments.

Some of the results of experiments conducted are illustrated in FIG. 2 which shows a plot of measured gain G values versus signal light wavelength for a photodetector which has been biased with a forward (i.e. from the lower electrode 18 towards the upper electrode 16) voltage of 0.6 V.

In this figure three different curves illustrate three different bias light illumination conditions: no bias light 30, red bias light 32 and blue bias light 34. These curves clearly show that photocurrent gain G, at 0.6 volts forward bias, depends on both the wavelength of the signal light and the presence and color of the bias light.

In particular, at this bias voltage, red bias light is seen to suppress gain G below that attainable with no bias light, whereas blue bias light is seen to enhance gain G above that attainable with no bias light. Furthermore, exceptionally large gains (well above 100) can be attained for signal light with wavelengths in the range of between 0.6 and 0.75 $\mu$m. Also apparent from the data is that, in this specific experiment and for all three bias light conditions, the peak gain G occurs when the signal light 22 has a wavelength $\lambda \sim 0.675$ $\mu$m.

Figure 3:
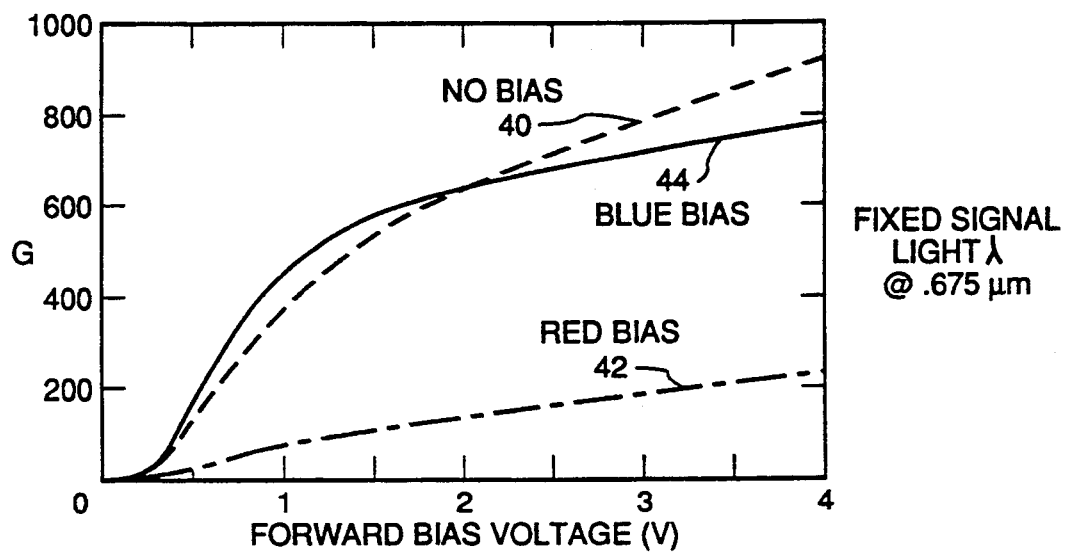
FIG. 3 is a plot of measured photocurrent gain G versus bias voltage V for a signal light with wavelength fixed at 0.675 μm under the three bias light environments used in FIG. 2.

Further experimentation was conducted to explore the dependance of gain G on forward bias voltages over the range of 0 to 4 volts. The results of this experiment are shown in FIG. 3 which is a plot of gain G versus bias voltage V for a signal light 22 with a wavelength fixed at 0.675 $\mu$m. The dashed curve 40 represents a condition of no bias light, the dot-dashed curve 42 that of red bias light and the solid curve 44 that of blue bias light. The wavelength of the signal light 22 was selected because, as noted in the discussion of FIG. 2 above, the peak gain for forward voltages for the structure used in this experiment occurred at this wavelength.

As can be seen from the figure, at lower bias voltages the blue bias light condition 44 gives the largest gain whereas, at higher bias voltages the condition where no bias light 40 is present gives the largest gain. This figure also illustrates gains of close to 1000.

Discussion of Experimental Results

It should be noted here that the effect described above requires a bias voltage beyond the flat band voltage and into the space charge limited regime of the device and that it does not require the presence of a bias light. As seen in FIG. 3, the presence of bias light can have little effect or even be detrimental. In fact, it was found that the relative effects of no bias light and blue bias light were functions of bias voltage.

For all the different devices with a 3 $\mu$m thick i-layer that were tested, it was found that the peak value for gain G always occurred at a signal light of a wavelength $\lambda \sim 0.675$ $\mu$m for forward bias voltages past the flat band condition for the devices. However, as is described below with reference to FIGS. 6 and 7, computer modelling simulations have shown that the peak gain and the signal light wavelength at which it occurs depend on the material properties and length (thickness) of the photodetector 10.

Explanation of Physics

What follows below is a brief discussion of what the applicants consider to be the physics of the effect described above.

In this discussion, it is best first to consider the situation without bias light present and then to discuss the effect of the bias light.

Before commencing this discussion, it must once again be emphasized that the large gains observed only occur when the energy bands of the photodetector 10 have moved past the flat band condition and into the space charge limited region where "dark" current is contributed by, depending on the device, a virtual cathode, virtual anode or both due to voltage biasing.

Figure 4:
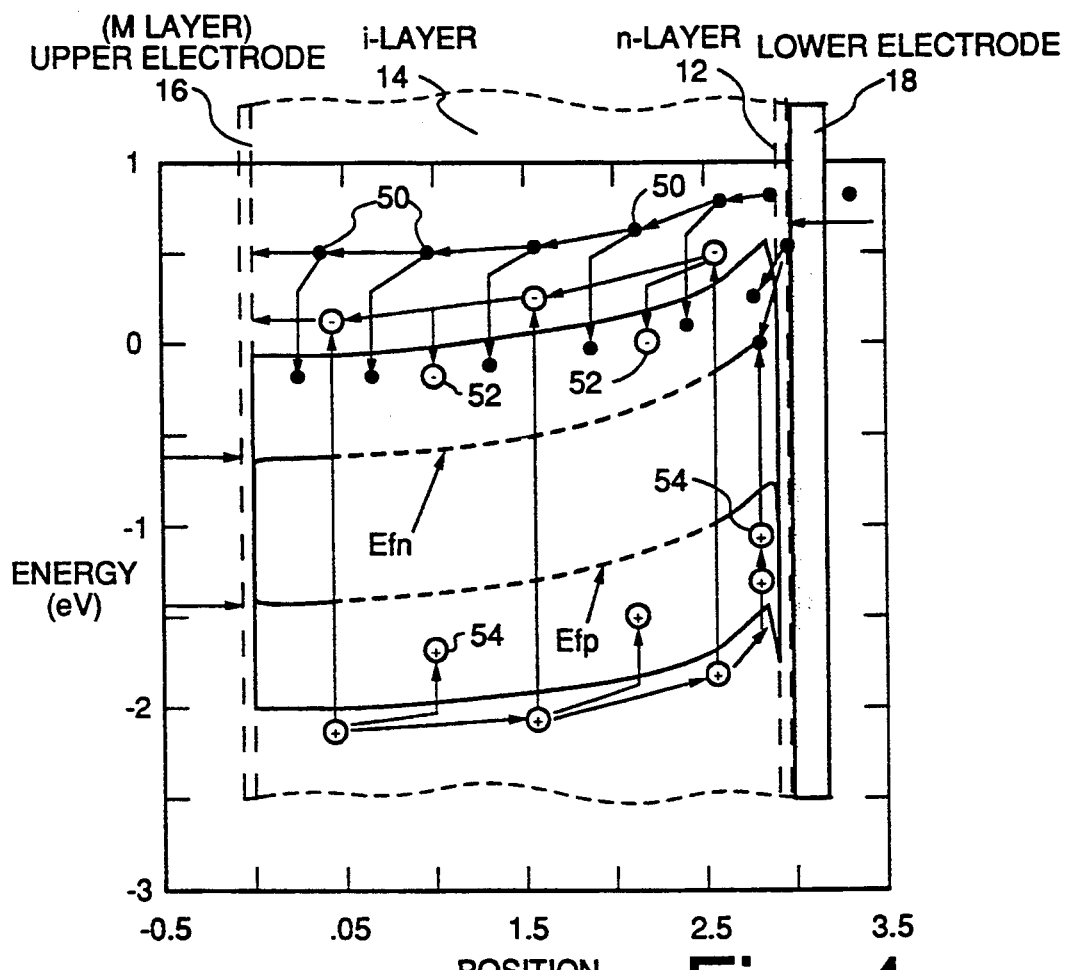
FIG. 4 is a band diagram showing the transport mechanisms for charges within the photodetector in FIG. 1.

This voltage biasing condition is illustrated in FIG. 4 which is a band diagram of the i-layer 14 of the photodetector 10 and shows the transport mechanisms for charges within the detector for a condition of no bias light and under an external forward bias voltage of 1 V. Dark circles 50 represent electrons injected through the lower electrode 18 and n-layer 12, circles with minus signs 52 represent photogenerated electrons and circles with plus signs 54 represent holes generated by the signal light 22 as it falls on the photodetector 10. The figure also indicates, in broken lines, the respective positioning of the m-, i- and n-layers 16, 14 and 12 respectively, as well as that of the lower electrode 18.

Computer modelling has shown that when a voltage, greater than the flat band voltage and sufficient to bias the detector into the space charge limited regime, is applied across this m-i-n photodetector, and no light of any kind is present, the following occurs:

Electrons 50 are injected through the n-layer 12 and cross the i-layer 14 by drift to finally cross and exit from the m-layer 16. For this condition of bias voltage the electrons 50 cross the i-layer as a space charge limited current (SCLC). Although almost all the electrons 50 injected into the i-layer 14 reach the m-layer 16, the number of electrons doing so is limited by an effective potential barrier (virtual cathode) located at the n-layer 12. This effective potential barrier is created by electrons 50 which have been injected from the lower electrode 18 but which have become trapped in defects at (or near) the interface between the n- and adjacent i-layers, 12 and 14, respectively. This trapping effectively holds or "dams" the electrons at the potential barrier and, as a result, comparatively few electrons injected at the electrode 18 pass into the i-layer 14.

Now, when chopped monochromatic signal light 22 is added to this situation, photocarriers (both electrons 52 and holes 54) are generated in concentrations which vary with time at the same frequency as the signal light's chopping frequency.

Although both electrons 52 and holes 54 are generated by the signal light 22, the contribution of the electrons 52 to the total electron population is insignificant at the signal light intensities considered. In fact, for these light intensities computer modelling shows that the photogenerated electron population is more than three orders lower than the "dark" electron populations. Hence the photogenerated electrons 52 seen in FIG. 4 play no role in producing the high gains shown in FIGS. 2 and 3. (It should be noted here that this comment applies to the m-i-n type of device, but does not necessarily hold true for other devices.)

On the other hand, even though the photogenerated hole current is also several orders lower than the electron current (overwhelmingly "dark" current), some photogenerated holes 54 migrate toward the virtual cathode (at the n-layer 12) and either get trapped or recombine with trapped electrons close to the lower electrode 18. In fact, very close to the lower electrode 18, these holes 54 encounter the potential barrier created by the trapped electrons responsible for the virtual cathode. This causes photogenerated holes 54 to be blocked from exiting the device and leads to their tendency to fill up traps or to recombine with trapped electrons. In either case the result is the same: the effective potential barrier, controlling the number of electrons injected into the i-layer 14, is modulated downwards or "lowered" thereby allowing a greater number of electrons to be injected into the i-layer (and from there proceed to and be rejected from the m-layer).

It is this modulating or gating of the electron potential barrier (virtual cathode) at the n-layer 12 which leads to the large modulated current flowing through the photodetector at the chopping frequency in response to the signal light 22 and which, in turn, leads to the large gains observed. It will be apparent, of course, that, as the signal light is chopped, the effective potential barrier moves "up" and "down" at the chopping frequency. Hence the current "pulses" through the detector at the chopping frequency of the light. [Although this chopping is not essential for the operation of the invention, it has the practical advantage of making the detection of the electric signal, generated in response to the signal light, less complicated to detect.]

Although photogenerated holes 54 also get trapped along the whole i-layer, the photocurrent gain comes from the holes 54 trapped close to the virtual cathode. In fact, detailed computer analysis shows that either an increase of the cross section for holes 54 or a decrease of the cross section for electrons tends to enhance the photocurrent gain value only when these modifications are made on traps located in the i-layer 14 close to the virtual cathode or in the n-layer 12. Computer modelling simulations also show that detrimental effects on the photocurrent gains occur if these modifications are done either at the front (near the m-layer 16) or at the middle part of the i-layer 14 (once again, in the m-i-n structure being discussed here).

Once the electron injected current is enhanced by the virtual cathode barrier modification as described above, a redistribution of the trapped electron concentration is observed in the simulations from the virtual cathode toward the m-layer 16. Modelling simulations show that, for the particular 3 $\mu$m thick i-layer m-i-n device used in the experimental work, the pile-up of holes 54 around the interface between the i-layer 14 and the n-layer 12 and the redistribution of trapped electrons in the whole i-layer 14 reinforces the electric field at the virtual cathode and weakens the electric field at the metal-semiconductor interface.

Figure 5A:
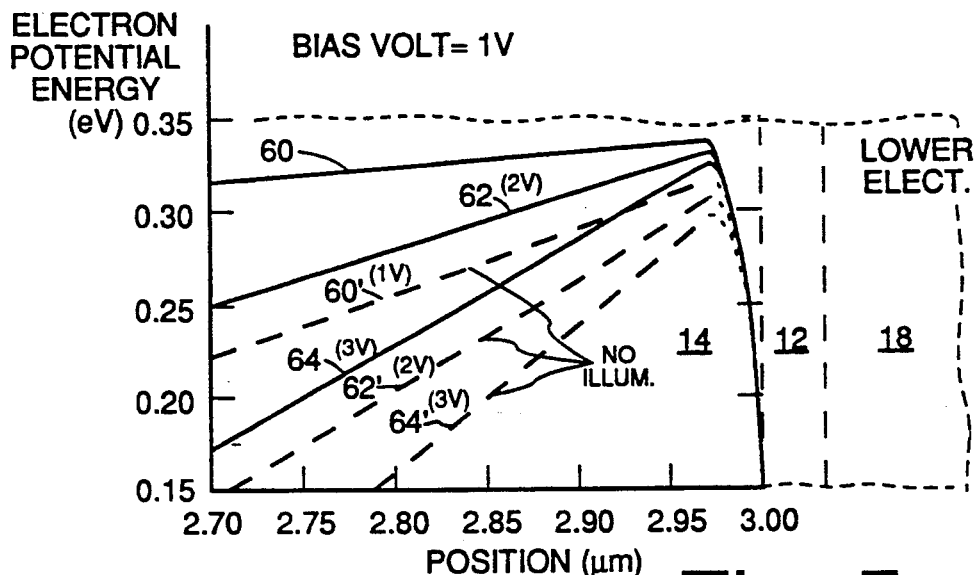
FIG. 5(a) is a plot illustrating the modification of the electron potential energy predicted by computer modelling around the n-layer under different forward bias voltage conditions.
Figure 5B:
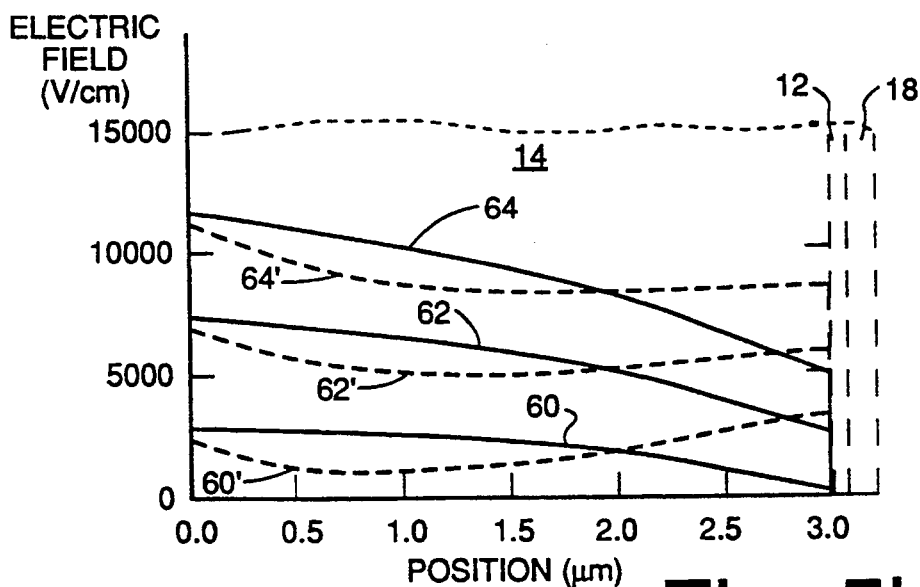
FIG. 5(b) is a plot illustrating the modification of the electric field predicted by computer modelling in the photodetector under the same forward bias voltage conditions as in FIG. 5(a)

The above is further illustrated by FIGS. 5a and 5b which respectively show the modification of the electron potential energy and of the electric field, (as predicted by computer modelling) occurring in the i-layer 14. Curves 60 and 60' represent a bias voltage condition of 1 V, curves 62 and 62' that of 2 V and curves 64 and 64' that of 3 V. The dashed curves show the case of only the dark current flowing (no illumination) and the solid curves the case of illumination by a monochromatic signal light 22 with a 0.675 $\mu$m wavelength and flux density of $7 \times 10^{13}$ photons/cm$^2$/sec.

The physics of the effect described above is very different from the usual bulk photoconductive secondary photocurrent gain situation in which photocarriers directly carry the current. In fact, as is noted above, computer modelling shows that photogenerated electrons do not significantly contribute to the total current and thus this effect cannot be explained in terms of the secondary photoconductivity gain given by the simple ratio of the electron lifetime $\tau_n$ to the electron transit time $T_r$. (As was described by Crandall above.)

What this invention is based on is an injection modulation phenomenon taking place at the interface between the i- and n-layers 14, 12 due to carrier trapping. It is different from the effect suggested by the Street reference above because the high gain G values rely on this trapping. As can be seen in the experimental results, this effect can be so significant in a-Si:H that it can lead to gains close to 1000 under no bias light conditions.

From FIGS. 2 and 3 it can be seen that the photogains illustrated can be affected by the presence of a constant bias light. Computer modelling shows red bias light diminishes the photo-gating effect described above because holes generated by the red bias light get trapped close to the lower electrode 18. Hence, the modulation induced by the holes 54 (generated by the signal light 22) is overwhelmed by the trapping and recombination changes produced by the red bias light. Thus the gain G in response to the signal light is much less intense as can be seen in FIGS. 2 and 3.

On the other hand, as shown in FIG. 3, blue bias light enhances the gain G in the lower voltage regimes (below 1.6 V) over that seen for no bias light. This is because the blue bias light creates photocarriers close to the upper electrode 16 due to the high absorption coefficient characteristic of blue wavelengths. Photogenerated holes 54, produced by the blue bias light at voltage biases over the flat band condition, move toward the lower electrode 18 but most of them get trapped in the front part of the i-layer. This modifies the field so that it is stronger in the back of the i-layer. This, in turn, leads to efficient collection, at the virtual cathode, of holes 54 produced by the signal light 22. Under certain conditions, therefore, blue bias light enhances the virtual cathode modulation. As seen in FIG. 3, this effect diminishes with larger forward bias because the field caused by the bias is stronger in the i-layer and not as easily modified by the bias light.

Finally, under this discussion, it should be noted that the peak gain is observed (in devices with 3 $\mu$m thick i-layers) with a signal light of wavelength around 0.675 $\mu$m because long wavelength photons are more uniformly absorbed in the i-layer 14 and thus more photogenerated holes 54 can get to the virtual cathode region. However, for signal light with even longer wavelengths the number of absorbed photons in the device will be lowered by the optical losses.

Invention Applied to p-i-n, n-i-n and Other Structures

Computer simulations have also predicted that high gains are possible in amorphous silicon p-i-n, m-i-p, p-i-p, n-i-n and i-p+ devices for voltages over the flat band condition. These gains have already been confirmed experimentally in a-Si:H p-i-n homojunctions.

The physics behind high gains in m-i-p structures is the same as that for m-i-n structures except that the roles of holes and electrons are reversed.

Similarly, the physics behind the high gains in p-i-n homojunctions and p-i-p and n-i-n structures is the same as for the m-i-n devices described above as the necessary condition for attaining this effect is to have a trap-laden material, like amorphous silicon, which can trap electrons and holes close to the electrodes and to have the device biased beyond the flat band condition (into the space charge limited regime), so that the dark current can be controlled by a virtual cathode, by a virtual anode or by both. Computer modelling shows that the n-i-n structure, fabricated with exactly the same i- and n-layers produces slightly higher values of G than a corresponding m-i-n structure, for example. On the other hand a p-i-n structure similarly fabricated produces slightly lower photocurrent gain values. This result comes from the fact that the n-i-n and the m-i-n structures offer good blocking contacts for the injection of holes from the top electrode into the i-layer. This is precisely the condition needed to allow photogenerated holes to exert their most influence.

The p-i-n structure, on the other hand has a non-blocking front layer and consequently holes injected into the p- and i-layers from the top electrode will be pushed by the electric field, together with the photogenerated holes, toward the virtual cathode and blocked there. This will decrease the effectiveness of the photogenerated holes in modulating the effective potential barrier. A p-i-n homojunction with identical i- and n-layers to the Schottky barrier structure shows a lower photocurrent gain even if good electrical quality p-layers allow the p-i-n structure to reach higher high forward SCLC dark currents.

It should be noted here that although the Schottky barrier produces lower values of gain G than the corresponding n-i-n, it is the simplest of these structures as it requires only one doped layer.

Dependence of Gain on i-layer Thickness and Mobility Gap

Using computer modelling the dependence of the photocurrent gain G on the i-layer thickness of the Schottky barrier structure was also explained. For this study, it was assumed that a bias voltage of 2 V was applied and that no bias light present.

Figure 6:
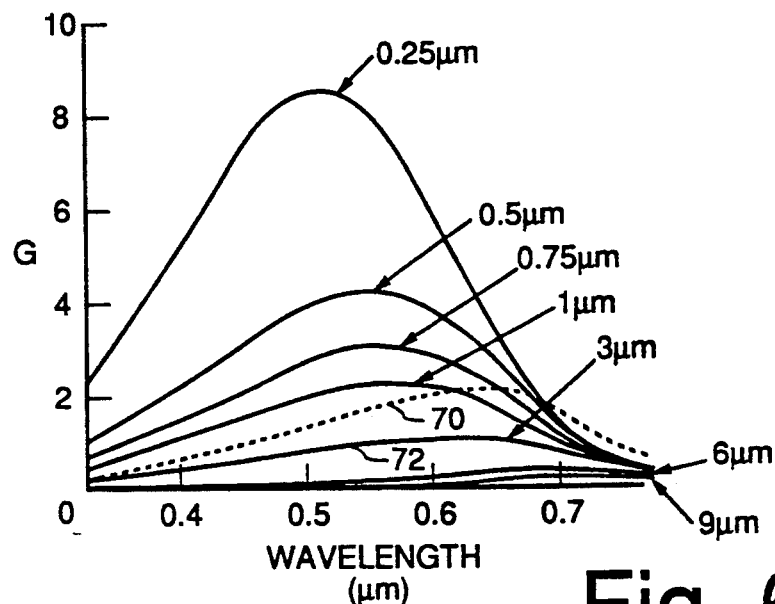
FIG. 6 graphically illustrates the relationship between photocurrent gains G and i-layer thicknesses.

FIG. 6 shows the results of this study in a plot of photocurrent gain G versus signal light wavelength for different i-layer thicknesses. This figure illustrates that the wavelength (of the signal light) where gain G reaches its maximum moves to longer wavelengths of signal light for thicker i-layers.

It should be noted here that FIG. 6 shows G values of between 0 and 10. This is because these G values have been normalized to the maximum value of G obtained for a device with a 3$\mu$ thick i-layer. As a result only relative comparisons can be made when comparing this figure with FIG. 2.

This result is not surprising because the thinner the i-layer the easier it becomes for shorter wavelength photogenerated holes 54 to reach the interface between the i- and n-layers. At the same time optical losses cause a decrease of the total amount of electron-hole pairs optically generated in the i-layer by longer wavelengths.

FIG. 6 also shows that the photocurrent gain G decreases with increasing i-layer thickness. This result is the combination of two phenomena occurring simultaneously. As already mentioned, the thickness of the Schottky barrier i-layer will determine how many of the photogenerated holes 54 will survive to get trapped near the virtual cathode. Besides this, however, the electric field is stronger across thinner i-layers and more electrons can be pulled out from the virtual cathode. Hence, the dark current is higher for the same Schottky barrier structure if the i-layer is made thinner and thus photogenerated holes 54 have the opportunity to modulate higher dark current levels. The result of these two phenomena is the photoconductive gain dependence on thickness seen in FIG. 6.

In addition, FIG. 6 illustrates, with the dashed-line curve 70, the computer modelled prediction for a 3 $\mu$m thick i-layer Schottky barrier (the same structure used in the experiments described above) when the mobility gap is lowered from 1.9 eV to 1.8 eV. When the mobility gap was lowered in these simulations, the density of gap states' distribution was frozen (not changed) for energies between the conduction bank edge and the valence band edge of the smallest mobility gap. Computer modelling shows that under these conditions the photocurrent gain G increases if the mobility gap is lowered. This is evident from a comparison between the dashed-line curve 70 and the solid curve 72 which represents the same device but with a 1.9 eV mobility gap.

The reason for this lies in the fact that the dark current level increases as the mobility gap is lowered. This occurs because when the mobility gap is decreased, the activation of energies of the i and n-layers is correspondingly decreased. Hence, there are more electrons to be injected into the i-layer. The result is a larger dark current that can be modulated. However, if the activations energies are kept identical in the i and n-layers after the mobility gap is moved down to 1.8 eV, a clear dependence of the photocurrent gain with the mobility gap is not observed.

Dependence of Gains G with Degradation of the i-layer

Computer modelling was also used to study the relationship between the degradation of the a-Si:H in the i-layer of the Schottky barrier and the photocurrent gain G. Once again it was assumed that there was no bias light present. The degraded material was modelled by increasing uniformly the density of midgap states in the whole i-layer in the range $1.5 \times 10^{15}$ to $5 \times 10^{16}$ cm$^{-3}$. These simulations were done assuming an i-layer thickness of 3 μm.

Figure 7:
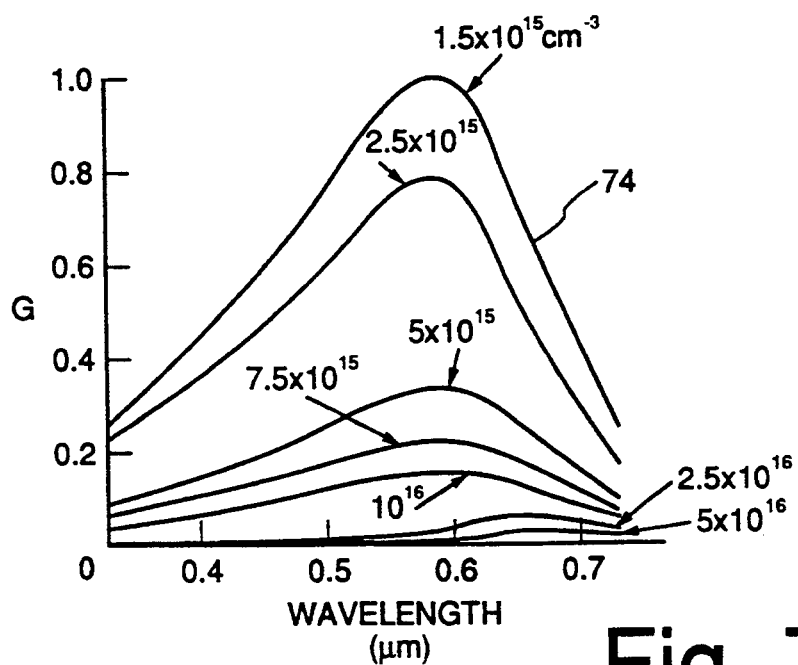
FIG. 7 graphically illustrates the relationship between photocurrent gains G and different densities of midgap states in the i-layer of the m-i-n photodetector of FIG. 1.

The results of these simulations are illustrated in FIG. 7 and show that the higher density of midgap states in the i-layer (i.e., the greater the degradation of the amorphous material) the lower the gain G. This is because the higher density gives rise to a region richer in trapped electrons close to the virtual cathode. This, in turn, tends to increase the effective potential barrier height. However, the simulations show that the electric field around this region also gets reduced by the presence of more trapped electrons. The higher barrier at the virtual cathode and the weaker electric field allows for less injection of electrons into the i-layer. Hence, photogenerated holes 54 filling traps at the virtual cathode region will modulate a lower high forward dark current value. In addition, a higher density of midgap states richer in trapped electrons close to the virtual cathode reduces the effectiveness of the photogenerated holes 54 modulation of the virtual cathode barrier.

It should also be noted that the curves in this figure have been normalized to the maximum value of the curve 74 which represents an annealed state with an assumed density of midgap states of $1.5 \times 10^{15}$ cm$^{-3}$.

Dependence of Gain G on the Intensity of the Signal Light

Figure 8:
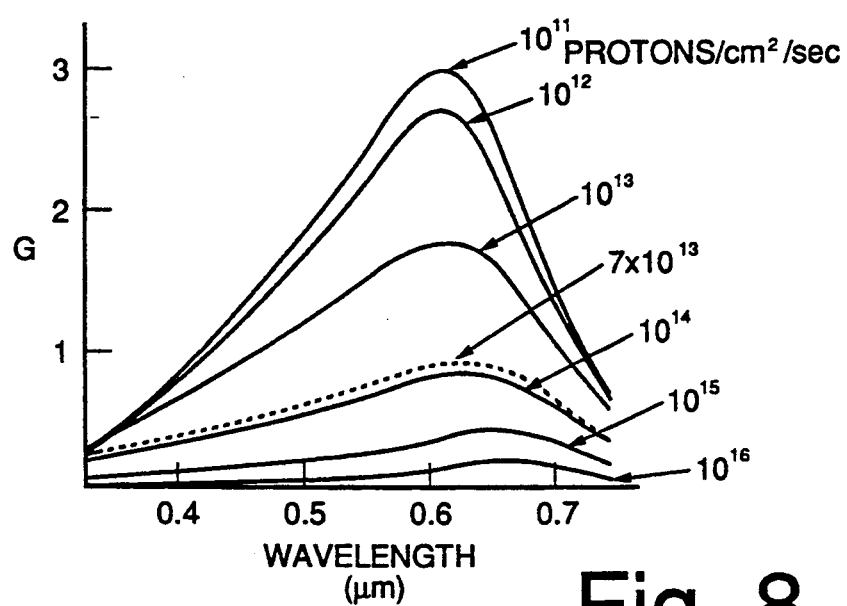
FIG. 8 graphically illustrates the relationship between photocurrent gains G and different monochromatic signal light intensities.

In addition to the above the dependence of the photocurrent gain G in a-Si:H Schottky barriers on the intensity of the signal light was studied. FIG. 8 shows computer simulations of the photocurrent gain G as a function of the signal light intensity in the range $10^{11}$–$10^{16}$ photons/cm$^2$/sec. The gains in this Figure have been normalized to the maximum value obtained for a signal light of an intensity of $7 \times 10^{13}$ photons/cm$^2$/second.

Of course, higher signal light intensities increase the number of photogenerated holes 54 (and photogenerated electrons 52) in the i-layer 14. Photogenerated holes 54 migrate to the virtual cathode and photogenerated electrons 52 and excess injected electrons 50 coming from the lower electrode 18 migrate to the front electrode/m-layer 16. This migration of free carriers gives rise to higher concentrations of trapped electrons and holes 54 at the upper electrode 18 and at the virtual cathode, respectively, when the intensity of the monochromatic light is increased.

In an a-Si:H device which is biased past the flat band condition this charge redistribution diminishes the electric field at the front part of the i-layer 14 and reinforces the electric field at the back part of the i-layer to a greater extent when the monochromatic light intensity is increased. Hence the a-Si:H high forward dark current which, of course, is the same for different illumination intensities, gets more strongly modulated for higher monochromatic light intensities. However, the modulated injected electron current produced by the photogenerated holes 54 does not grow at the same rate as the monochromatic light intensity does.

The computer modelling simulations show that the cause of this is the decrease of the electric field at the front part of the i-layer for higher monochromatic light intensities. This decrease gives rise to a preferential trapping of photogenerated holes 54 in the front region of the device. Hence, for higher monochromatic light intensities the density of trapped holes at the virtual cathode does got grow proportionately with the monochromatic light intensity. Therefore G decreases—as seen in FIG. 8 and as was verified experimentally—with increasing monochromatic light intensity for the defect distribution assumed.

Effect of i-layer Material on Gain and Signal Light Intensities

Although the invention has been described above with respect to a-Si:H devices, the specific ranges of wavelengths of the signal and bias lights used to produce high photogains are dependent on the material making up the detector and will accordingly vary for different types of material used in the photodetector.

By way of example, Table 1 below illustrates general ranges of light wavelengths which should produce high gains in detectors made of three different amorphous materials.

| Material | Optional Bias light (nm) | Signal light (nm) |
|---|---|---|
| a-Si:H | 350 to 575 | 580 to 760 |
| a-SiC:H | 320 to 495 | 500 to 680 |
| a-SiGe:H | 520 to 795 | 800 to 940 |

This invention is very suited to applications where a weak incoming light signal needs to be detected and where an electronic signal, in response to the light signal is produced. It is therefore envisaged that this invention will find application in large arrays of detectors and will greatly improve the capability of devices such as optical scanners (e.g. fax machines or photocopiers); detectors for military applications; detectors in CAT scanners; and other devices used in real time holography, optical phase conjugation and real time signal processing.

In addition, the principles discussed above can be used in the detection of particles and can therefore be applied to particle detectors, particularly large array detectors such as those used to detect cosmic particles incident on the earth.

In the application as a particle detector the physics is very similar to that described above. It is, however, a particle (instead of a photon) which generates electron-hole pairs and it is this particle-generated hole which moves towards and modulates (or "lowers") the potential barrier thereby allowing the injection of a stream of electrons into the i-layer.

Furthermore, the experimental result discuss a photon entering the m-i-n device through its m-layer. This should, however, not be seen as a limitation to the invention as it could operate with the photon entering through the rear (n-layer) as well. In much the same way, the photon could in the application of this invention to other types of detector, enter the rear of these detectors as well.

Accordingly, although the present invention has been described in terms of specific embodiments, it is anticipated that alterations and modifications as well as the applications thereof will no doubt become apparent to those skilled in the art. It is therefore intended that the following claims be interpreted as covering all such alterations, modifications and applications as fall within the true spirit and scope of the invention.

What is claimed is:

1. A particle detector for detecting ionizing particles, the detector comprising:
   (i) a substrate;
   (ii) first electrode means formed on said substrate;
   (iii) a body portion supported by said first electrode, said body portion including at least two monolithic, contiguous amorphous silicon regions a first region of which is disposed proximate said first electrode means and is doped to be of a first conductivity type and a second region of which is disposed on said first region and is an intrinsic region, and wherein a region of defect states exist proximate the interface between said first and said second regions;
   (iv) second electrode means formed over said body portion; and
   (v) means to apply a forward bias voltage across said detector between said first and said second electrode means, wherein said voltage is greater than the flat band voltage of said detector and is sufficient to bias the detector into a space charge limited regime in which charge carriers, injected at the first electrode, are blocked by a potential barrier formed in the region of defects, such that, when an ionizing particle penetrates the detector, the potential barrier is modulated to allow previously blocked charge carriers to pass over the barrier and to move across the detector and be collected by the second electrode thereby providing an enhanced signal in response to the ionizing particle penetrating the detector.

2. The detector of claim 1, wherein the detector includes at least part of the region of defects at the interface between the two contiguous regions.

3. The detector of claim 2, wherein the ratio of charge carriers, passing across the modulated potential barrier to be collected by the second electrode, to the number of ionizing particles entering the body of the detector is greater than 1.

4. The detector of claim 3, wherein the ratio of charge carriers to particles is greater than 100.

5. The detector of claim 4, wherein the body of said detector is one of a group consisting of an m-i-n, m-i-p, p-i-n, n-i-p, p-i-p and n-i-n detector.

6. The detector of claim 4, wherein the ionizing particle penetrating the detector is a light photon from an incident signal light.

7. The detector of claim 6 further comprising means for chopping the signal light thereby repetitively modulating the number of photons incident on the detector, whereby the potential barrier is alternatively lowered and raised and, accordingly, the stream of charge carriers across said potential barrier is alternatively increased and decreased.

8. The detector of claim 7, wherein the thickness of said intrinsic region is determined by the wavelength of the signal light.

9. The detector of claim 8, wherein the material of said intrinsic region is determined by the wavelength of the signal light.

10. The detector of claim 4, further comprising a bias light source for illuminating the detector whereby such illumination further enhances the ratio of charge carriers to ionizing particles.

11. A method of detecting ionizing particles incident on a detector in which the ionizing particles form electron-hole pairs upon penetrating the detector, the method comprising the steps of:
    (i) providing a detector including a substrate; first electrode means formed on said substrate; a body portion supported by the first electrode, the body portion having at least two monolithic, contiguous amorphous silicon regions a first region of which is disposed proximate said first electrode means and is doped to be of a first conductivity type and a second region of which is disposed on said first region and is an intrinsic region, and wherein a region of defect states exist proximate the interface between said first and said second regions, second electrode means formed over said body portion; and
    (ii) applying a forward bias voltage across said detector between said first and said second electrode means, wherein said voltage is greater than the flat band voltage of said detector and is sufficient to bias the detector into the space charge limited regime in which charge carriers, injected at the first electrode, are blocked by a potential barrier formed in the region of defects, such that, when an ionizing particle penetrates said detector, the potential barrier is modulated to allow previously blocked charge carriers to pass over the barrier and to move across the detector to be collected by the second electrode thereby providing an enhanced signal in response to the ionizing particle.

12. The method of claim 11, wherein the step of providing a detector includes the step of forming the region of defects, at least partially, at the interface between the two contiguous regions.

13. The method of claim 12, wherein the ratio of charge carriers, passing across the modulated potential barrier to be collected by the second electrode, to the number of ionizing particles entering the body of the detector is greater than 1.

14. The method of claim 13, wherein the ratio of charge carriers to particles is greater than 100.

15. The method of claim 14, further comprising the step of illuminating the detector with a signal light wherein the ionizing particles penetrating the detector are light photons from the signal light.

16. The method of claim 15 further comprising the step of chopping the signal light thereby repetitively modulating the number of photons incident on the detector, whereby the potential barrier is alternatively lowered and raised and, accordingly, the stream of charge carriers across said potential barrier is alternatively increased and decreased.

17. The method of claim 14, further comprising the step of illuminating said detector with a bias light from a bias light source, whereby such illumination further enhances the ratio of charge carriers to ionizing particles.

* * * * *